United States Patent [19]

Jenekhe

[11] Patent Number: 4,624,999
[45] Date of Patent: Nov. 25, 1986

[54] ELECTRICALLY CONDUCTING COMPLEXES OF POLYMERS OF N-SUBSTITUTED CARBAZOLES AND SUBSTITUTED BENZALDEHYDES

[75] Inventor: Samson A. Jenekhe, Bloomington, Minn.

[73] Assignee: Honeywell Inc., Minneapolis, Minn.

[21] Appl. No.: 760,027

[22] Filed: Jul. 29, 1985

[51] Int. Cl.$^4$ ........................ C08F 283/00; C08G 2/00
[52] U.S. Cl. .................................... 525/509; 252/500; 252/518; 528/248
[58] Field of Search ................ 528/248, 211; 252/500, 252/518; 525/509

[56] References Cited

U.S. PATENT DOCUMENTS 2,306,924 12/1942 Zerweck et al. ..................... 528/248
4,452,725 6/1984 Wellinghoff et al. ............... 252/518
4,548,738 10/1985 Jenekhe et al. ...................... 528/248

Primary Examiner—Edward J. Smith
Attorney, Agent, or Firm—Charles G. Mersereau

[57] ABSTRACT

Environmentally stable conductive organic polymers synthesized from carbazole or N-substituted carbazoles and benzaldehyde or substituted benzaldehydes doped with charge transfer acceptors are disclosed.

23 Claims, 1 Drawing Figure

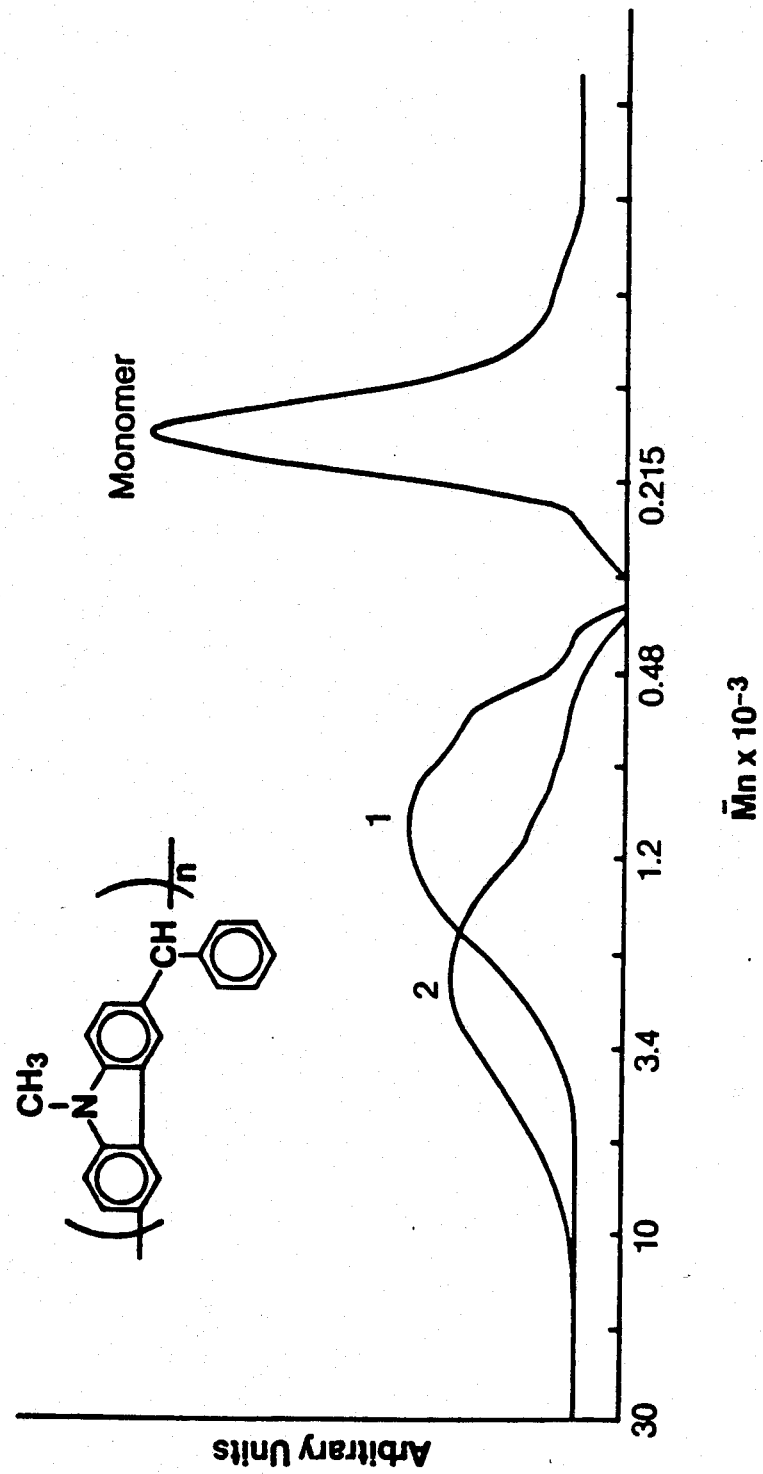

ELECTRICALLY CONDUCTING COMPLEXES OF POLYMERS OF N-SUBSTITUTED CARBAZOLES AND SUBSTITUTED BENZALDEHYDES

BACKGROUND OF THE INVENTION

1. Field of the Invention

The present invention relates to environmentally stable organic polymers and, more particularly, complexes of processible polymers synthesized from N-substituted carbazoles and substituted benzaldehydes which, when doped with charge transfer acceptors, became highly electrically conductive.

2. Description of the Prior Art

Certain high molecular weight materials having intrinsic double bond structures such as polyacetylene, polythiazine and polypyrrole may become highly conductive when doped with certain electron acceptors or donors. Compounds of this nature have proved to be of a great deal of interest inasmuch as they may combine some of the traditional properties of organic polymers such as high strength, lightweight, flexibility and low temperature processing together with selective electrical properties including high electrical conductivity. In addition, the cost of polymers is relatively low.

Such materials undoubtedly will have an important impact on many areas of technology, especially the electronics industry. For example, experimental batteries made from conducting polymers have been shown to have a potential to exceed current power sources in both power and energy densities. Other areas of potential applications include chemical or gas sensors, low cost, large area optical sensors, switches, lightweight electrical connections, wire, and in their film form for many types of microelectronic circuits and large area solar cells.

Organic materials that behave as metals or semiconductors provide the advantages of these materials together with additional advantages of being soluble in organic solvents or having low melting points and glass transition temperatures. This minimizes the cost of processing and permits composites to be made with thermally sensitive materals such as doped Si or GaAs, for example. The enormous molecular design flexibility of organic chemistry enables precise tailoring of properties to fill a wide range of applications as enumerated above. In addition, the high strength and conductivity-to-weight ratios lend the advantage of fabrication of many electrical devices of much lower weight than conventional materials.

In the prior art, a large number of polymeric conductors have been made. These include polyacetylene and its analogues which may be doped with $I_2$, $AsF_5$ and $BF_4^-$ or the like. In addition, various phenylene polymers and phthalocyanine complexes have been synthesized as conductive materials.

Highly conducting p-type materials have been obtained by doping a polymer with a charged transfer acceptor such as $I_2$ or $AsF_5$ from the gas or with $ClO_4^-$ or $BF_4^-$ by electrochemical oxidation. An n-type material has been achieved by a doping with alkali metal. In known cases of these two types of materials, however, to date only the p-type show any environmental stability.

Theoretically, conductivity takes place both along the polymer chain and between adjacent chains. The active charge carrier, at least in the aromatic materials, is believed to be a bipolaron that is delocalized over several polymer repeating units. The mobility of such a species along the polymer chain is reduced by conformational disorder, necessitating a rigid highly crystalline chain structure for maximum intrachain conductivity. Various mechanisms such as "hopping" and interchain exchange" are thought to be responsible for the interchain part of the conductivity. Unfortunately, all of the most highly crystalline polymers of high conductivity are insoluble and infusable. Such is the case with the most common prior art conducting polymer, polyacetylene, which because of this, must be used in the same form as polymerized. In film form it is a highly porous fibrillar network which is tough and can be electrochemically doped very rapidly. Polyacetylene films have been used in lightweight storage batteries and can also be used to make Shottky barriers which exhibit a photovoltaic effect.

Other slightly less conductive materials include doped poly p-phenylenes; however, poly p-phenylene can be processed only by powder metallurgical techniques, precluding thin film applications. Two solution processible polymers that are known to have been doped to high conductivities in the prior art are poly m-phenylene and poly m and p-phenylene sulfides. $AsF_5$ which has a very high electron affinity has been used successfully to generate radical cations in these polymers. Unfortunately, these polymeric cations are so unstable that crosslinking and ring fusion reactions occur. This, together with high water sensitivity, greatly reduces the utility of the polymers.

Thus, in the prior art, because of the nonprocessibility of these base polymers, thin films and uniform doping have both been difficult to achieve. One such attempt to remedy this difficulty consisted of co-evaporating biphenyl with $AsF_5$ to simultaneously polymerize the biphenyl and subsequently dope the p-phenylene polymer on the substrate. This procedure has also been used with several aromatic and heteroaromatic monomers capable of undergoing Lewis acid induced oxidative polymerization with an active radical cation chain end. Invariably black insoluble films of somewhat undetermined composition have resulted. Conductivities as high as $10^{-2}$/ohm-cm were reached, however. This process for generating thin films is somewhat similar to the solid state polymerization of evaporated $S_2N_2$ thin films to a semiconducting $(SN)_x$ of rather low environmental stability.

Other conducting polymers which have been electrochemically synthesized and simultaneously doped are polypyrrole type films which show conductivities as high as $10^2$/ohm-cm, and are stable in air. Unfortunately, these films are also intractable and of somewhat indefinite composition.

Successful environmentally stable doped conducting polymers are described in U.S. Pat. No. 4,452,725 to S. T. Wellinghoff, S. A. Jenekhe (the inventor in the present application) and T. J. Kedrowski which is assigned to the same assignees as the present application. That patent concerns conducting polymers of N-alkyl 3,6'carbazolyl chemically doped with charge transfer acceptor dopants such as the halogens. In addition, other successful conducting polymers are described in applications Ser. No. 626,565 filed June 29, 1984 now U.S. Pat. No. 4,548,738, issued Oct. 22, 1985 and Ser. No. 737,612 filed May 24, 1985, now U.S. Pat. No. 4,569,482, issued Feb. 2, 1986, also to S. A. Jenekhe and B. J. Fure which is also assigned to the same assignee as the present invention. That application describes condensation polymers of 3,6 N-alkylcarbazolyl and aliphatic aldehydes. These polymers are also doped with charge transfer acceptors to become highly conductive materials.

SUMMARY OF THE INVENTION

The present invention provides a new class of thermoplastic organic/heterocyclic linear condensation polymeric materials which are solution and/or melt processible to films, fibers, and other shapes, which when doped with suitable electron acceptors exhibit controllable high p-type conductivity in the range characteristic of semiconductors. The polymers are products of condensation polymerization of N-substituted carbazoles with substituted benzaldehydes. The polymers can be doped with a compatible charge transfer donor or acceptor to produce the desired conductivity. This endows the materials with the above polymer properties as well as enhances the conjugation of the base monomer units through chain length extension, thereby lowering the ionization potential and favoring delocalization of electrons or other charge carrier.

The undoped materials have good ambient air stability, are thermoplastic but exhibit excellent thermal stability in air up to temperatures above 200° C. The doped polymers are capable of combining high electrical conductivity with good mechanical and thermal stability.

The compounds of the present invention have the general formula:

Structure A

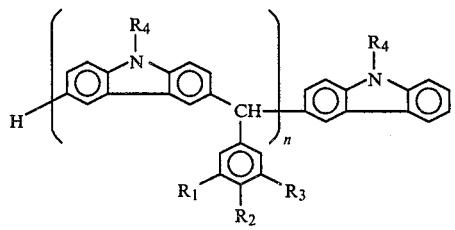

where:
$R_1$=H, $CH_3$, F, Cl, Br,
$R_2$=H, $CH_3$, $NO_2$, OH, —$OCH_3$, F, Cl, Br, —S—$CH_3$,
$R_3$=H, $CH_3$, F, Cl, Br,
$R_4$=H, $CH_3$, $C_2H_5$, $Si(CH_3)_3$.

The undoped polymers are prepared by acid catalyzed polymerization of N-substituted carbazole with benzaldehyde or a substituted benzaldehyde. In the preferred embodiment the reactants are N-methylcarbazole and benzaldehyde. The acid catalyst may be any suitable protic acid ($H^+X^-$) and is normally sulfuric acid, perchloric acid ($HClO_4$), fluoroboric acid $HBF_4$, or acetic acid. The doped conducting polymer may be obtained from the undoped polymer by any suitable doping process. This may be by exposure of the polymer to a vapor of the dopant or immersion of the polymer in a solution of the dopant or by electrochemical means. Iodine, $BF_4^-$, $ClO_4^-$, $HSO_4^-$ and bromine are the preferred charge transfer acceptor dopants. However, any one of a large number of other dopants can be used.

BRIEF DESCRIPTION OF THE DRAWINGS

The single FIGURE shows Gel Permeation Chromatograph traces for polymers of Examples I and II.

DESCRIPTION OF THE PREFERRED EMBODIMENT

Polymer Synthesis

The general process for making the polymers of the present invention can be illustrated by the following:

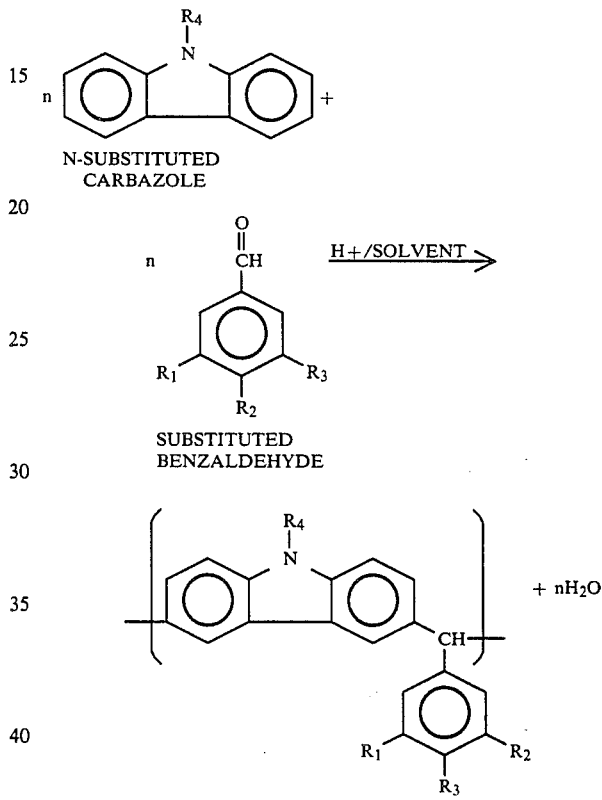

where $R_1$, $R_2$, $R_3$ and $R_4$ are the same as for Structure A, above. The proton ($H^+$) catalyst is derived from any protic acid ($H^+X^-$) such as $H_2SO_4$, $H_2SO_3$, $HClO_4$, and $HBF_4$. Suitable solvent mediums include dioxane, tetrahydrofuran (THF), dimethylformamide (DMF), N-methyl-2-pyrrolidone (NMP), 2,2-dimethylacetamide (DMAc), and m-Cresol. The reaction temperature is nominally in the range 50° C.–150° C., i.e. such that it is below the boiling point of the solvent. The reaction is normally carried out in an inert atmosphere such as one of argon, but it may be accomplished using any compatible atmosphere, such as dry air.

The reaction time is related to the desired molecular weight or degree of polymerization as the examples that follow further illustrate. In this regard, applications vary and may utilize polymers of various degrees of polymerization from oligomers to high polymers. The exact molecular weight, of course, will vary widely with the exact polymer structure and average degree of polymerization. Generally, the average molecular weight will increase with increasing reaction time. No particular limiting range of n for the number of repeating groups is known and that number will depend on the end-product properties desired. While the number is not considered limiting, n, for most useful compounds, is thought to be between 2 and 500. In many useful compounds a value of n between about 2 and 50 has produced good results. The definition of "polymer" for the purposes of this specification shall be meant to include dimers and oligomers.

Likewise, within the process parameters, temperature is not critical. The only criteria is that it be high enough for the reaction to proceed at an acceptable rate and below the boiling point of the solvent under reaction conditions.

The polymers of the present invention are, by way of example, illustrated by poly(3,6-N-methylcarbazolyl phenylmethylene), abbreviated (PMCZPM) and others. The following examples exemplify typical polymer preparation procedures:

EXAMPLE I

A solution of 36.248 g (0.20 mole) N-methylcarbazole (NMCZ) and 20.33 ml (density=1.044 g/cm$^3$; 0.20 mole) benzaldehyde (Baker Chemical Co.) in 240 ml dioxane (Kodak) containing 60 ml glacial acetic acid (density=1.049 g/m$^3$) and 3.68 ml conc. H$_2$SO$_4$ (density=1.84 g/cm$^3$) was prepared in a 1000 ml 3-neck flask in a flowing argon atmosphere. The temperature of the reaction vessel placed in an oil bath was raised to 92° C. and kept constant. The polymerization reaction ran for 23 hr. 20 min. Then the reaction mixture was quenched in 2.5 liters of rapidly stirring methanol to precipitate the product which was subsequently dissolved in tetrahydrofuran (THF) and reprecipitated in methanol to produce a light blue polymer.

The light blue polymer can be further purified by dissolving in THF and adding three parts by volume of 0.5N NaHCO$_3$ aqueous solution to two parts of THF polymer solution. A whitish to light brown polymer results. The light blue and off-white polymeric products are identical in molecular weight and other polymer properties except that the light blue polymer is partially oxidized as evidenced by UV-visible absorption spectra which shows an absorption band in the visible for the light blue product and none for the off-white or light brown product.

EXAMPLE II

The same procedure as in Example I was used except that 300 ml dioxane solvent and no acetic acid was used. The reaction was carried out for 71 hours.

EXAMPLE III

A solution of 3.624 g (0.02 mole) N-methylcarbazole and 1.02 ml (0.01 mole) benzaldehyde (Baker Chemical Co.) in 15 ml dioxane containing 0.18 ml H$_2$SO$_4$ was sealed in a 1-inch diameter×5 inch long pyrex glass tube by freezing the solution and vacuum pumping. The reaction vessel was rotated at 100 rpm to stir the solution and was heated in an oil bath at 92° C. for 22 hrs. The reaction mixture was quenched in methanol. The product was dissolved in THF and reprecipitated in methanol giving a light blue polymer. A light brown polymer was subsequently obtained as in Example I.

EXAMPLE IV

The same procedure as in Example III except that 1.812 g (0.01 mole) N-methylcarbazole and 2.04 ml (0.02 mole) benzaldehyde were used. The product was a light blue polymer from which the light brown product was obtained as in Example I.

EXAMPLE V

The same procedure as in Example II was used except that the reaction was carried out for 120 hrs. the polymer product was light blue.

EXAMPLE VI 60 ml acetic acid and 3.68 ml conc. H$_2$SO$_4$ were added to 100 mnl dioxane solvent in a 1000 ml three-neck reaction vessel under flowing argon atmosphere. Then, 21.224 g (0.20 mole) benzaldehyde (BA) was added. A solution of 36.248 g (0.20 mole) N-methylcarbazole (NMCZ) in 140 ml dioxane was added dropwise. The reaction solution was dark blue when mechanical stirring at 100 rpm was started. After 1 hr, the reaction temperature was steady at 92° C. and the reaction solution was still dark blue. After a total of 23 hr and 20 min reaction time, the polymerization mixture was quenched in 2500 ml methanol, precipitating a bluish-white product. The polymer was dissolved in THF, reprecipitated in methanol and recovered.

EXAMPLE VII

A reaction mixture of 36.248 (0.20 mole) NMCZ, 20.33 ml (0.20 mole) BA, 3.68 ml conc. H$_2$SO$_4$, and 300 ml dioxane under flowing argon atmosphere in a 1000 ml reaction vessel was prepared as in Example 6. The reaction temperature was 92° C. and total polymerization time was 71 hr. The polymer (ca 36.0 g) was recovered as in Example I.

EXAMPLE VIII

A mixture of 0.004 mole N-methylcarbazole and 30 ml dioxane (Kodak) was added to a round bottom flask containing 35.93 ml dioxane, 0.048 mole p-fluorobenzaldehyde (Fairchild), and 0.81 ml concentrated H$_2$SO$_4$ (Malinkrodt). With an atmosphere of flowing argon, and a mechanical stirrer (100 rpm) the reaction ran for 69 hours 45 minutes in an oil bath temperature of 93° C. The blue product of poly(3,6-N-methylcarbazolyl fluorophenylmethylene) was recovered in methanol.

EXAMPLE IX

A mixture of 0.067 mole N-methylcarbazole and 100 ml dioxane (Kodak) was added to a round bottom flask containing 150 ml dioxane, 0.067 mole p-nitrobenzaldehyde (Fairchild), and 0.81 ml concentrated H$_2$SO$_4$ (Malinkrodt). The reaction vessel was placed in an oil bath (T=94° C.) and argon was flowed through it. The reaction was mechanically stirred (100 rpm) and ran for approximately 48 hours. A green product of poly(3,6-N-methylcarbazolyl p-nitrophenylmethylene) was recovered in methanol.

EXAMPLE X

A mixture of 0.067 mole N-methylcarbazole and 100 ml dioxane 150 ml dioxane (Burdick and Jackson) was added to a round bottom flask containing 150 ml dioxane, 0.067 mole p-hydroxybenzaldehyde, and 5.23 ml concentrated H$_2$SO$_4$ (Malinkrodt). The reaction vessel was placed in an oil bath (T=94° C.) and argon was flowed through the apparatus. The reaction was mechanically stirred (100 rpm) and ran for approximately 48 hours. A blue product of poly(3,6-N-methylcarbazolyl p-hydroxyphenylmethylene) was collected using methanol.

The yield in polymerization reactions of Examples I-V is shown in Table I. Clearly at any given N-methylcarbazole (MCZ)/benzaldehyde (BA) mole ratio the yield increases with the polymerization time as would be expected for a condensation polymerization process. It is also not surprising that poor yield was obtained at MCZ/BA ratio of 2.0. However, for essentially the same reaction time of 22 hrs. at mole ratios of 1.0 and 0.5, the same yield is obtained, suggesting that unlike excess N-methylcarbazole, excess benzaldehyde can be a desired polymerization condition. Thus, for a fixed reaction time, high yield in polymerizations is achieved at equimolar stoichiometry or with excess aldehyde.

TABLE I

| PMCZPM Samples | MCZ/BA Mole Ratio | Polymerization Time (hrs.) | Yield (%) |
|---|---|---|---|
| Examples | | | |
| I | 1.0 | 23.33 | 57 |
| II | 1.0 | 71 | 67 |
| III | 2.0 | 22 | 30 |
| IV | 0.5 | 22 | 60 |
| V | 1.0 | 120 | 88.5 |

Doping and Dopants

The doping process in conductive polymers is similar to doping in classical inorganic semiconductors to the extent that in both cases the net effect of the process is that the electronic structures of the solids are modified by the dopants by either withdrawing electrons from the filled valence bands or injecting electrons into the empty conduction bands in order to create the partially filled bands necessary for electronic conduction in solids. However, unlike doping in classical inorganic semiconductors, doping in polymers involves oxidation (p-type doping) or reduction (n-type doping) reactions, which may be carried out by purely chemical or electrochemical methods, resulting in the generation of polymeric carbonium or carbanion ion which must be paired with a counter ion generated from the dopant.

Numerous inorganic and organic compounds can be used as dopants for generating the highly conductive polymer-dopant complex usually known as the "doped" polymer. However, a successful dopant for one polymer may not be successful for another polymer. Also, the stability of the dopant counter ion in solid state complex with the polymeric carbonium or carbanion ions varies from polymer to polymer. It is also to be expected that the size, shape, counter ion reactivity and stability with respect to such agents as $O_2$, $H_2O$ and temperature, counter ion charge, electron-accepting or donating properties, oxidation and reduction powers of dopants may contribute to effects of dopants on the electrical properties and environmental stability of doped conductive polymers.

Table II shows a list of most of the currently known dopants which have been successfully used to increase the conductivity of various polymers by manyfold. These dopants in their original state may be neutral molecules in the gaseous, liquid, or solid state or counter ions of nitrosyl ($NO^+$), nitronium ($NO_2^+$), tetraethyl ammonium ($Et_4N^+$), tetrabutylammonium ($Bu_4N^+$), or other salts. Most of the dopants listed in Table II are p-type dopants, i.e. they generate counter anions and polymeric carbonium ions. Alkali metal, alkali naphthalide and alkali anthracide have been used as n-type dopants. However, most of the n-type doped polymers are extremely unstable compared to the p-type doped polymers.

TABLE II

| Original Dopant Source | Dopant Counter Ion | Type of Doping |
|---|---|---|
| $I_2$ | $I_3^-$ | p-type |
| $Br_2$ | $Br_3^-$ | p-type |
| $Cl_2$ | $Cl_3^-$ | p-type |
| $AsF_5$ | $AsF_6^-$, (other) | p-type |
| $SbF_5$ | $SbF_6^-$, (other?) | p-type |
| $SO_3$ | ? | p-type |
| $FCl_3$ | $FCl_4^-$ | p-type |
| $BF_3$ | $BF_4^-$ | p-type |
| From Nitrosyl ($NO^+$), | $BF_4^-$ | p-type |
| Nitronium ($NO_2^+$), | $ClO_4^-$ | p-type |
| Tetraethylammonium | $SbF_6^-$ | p-type |
| ($Et_4N^+$), | $AsF_6^-$ | p-type |
| Tetrabutylammonium | $HSO_4^-$ | p-type |
| ($Bu_4N^+$), and other | $FSO_3^-$ | p-type |
| salts of the anion | $SO_3CF_3^-$ | p-type |
| for solution (chemical) | $COOCF_3^-$ | p-type |
| or electrochemical | $C_6H_2(NO_2)SO_3^-$ | p-type |
| doping | $CrC_6H_4SO_3^-$ | p-type |
| Alkali (K, Li, Na) metal | $Na^+, Li^+, K^+$ | n-type |
| Alkali Naphthalide | ? | n-type |
| Alkali anthracide | ? | n-type |

Similar to the observed doping mechanism in, for example, a methylene-bridged polymer, it is believed that the polymers of the invention undergo a doping-induced polymer backbone conjugation converting the phenylmethylene or substituted thenylmethylene to phenylmethine or substituted phenylmethine with acceptor doping as follows:

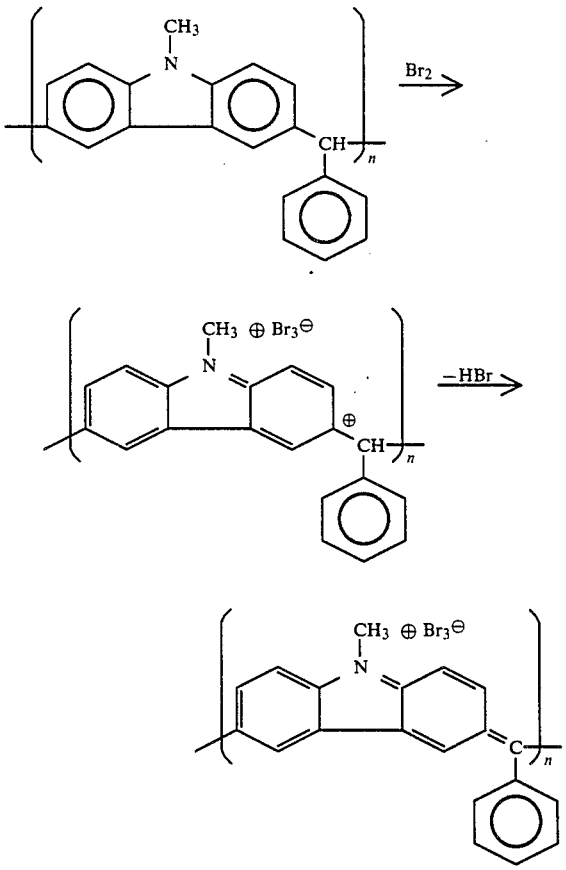

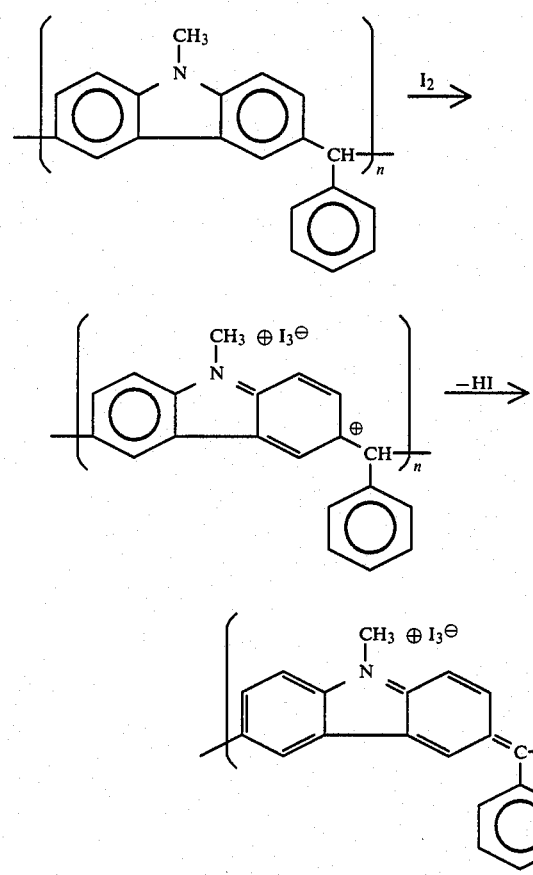

or, in general for the substituted forms,

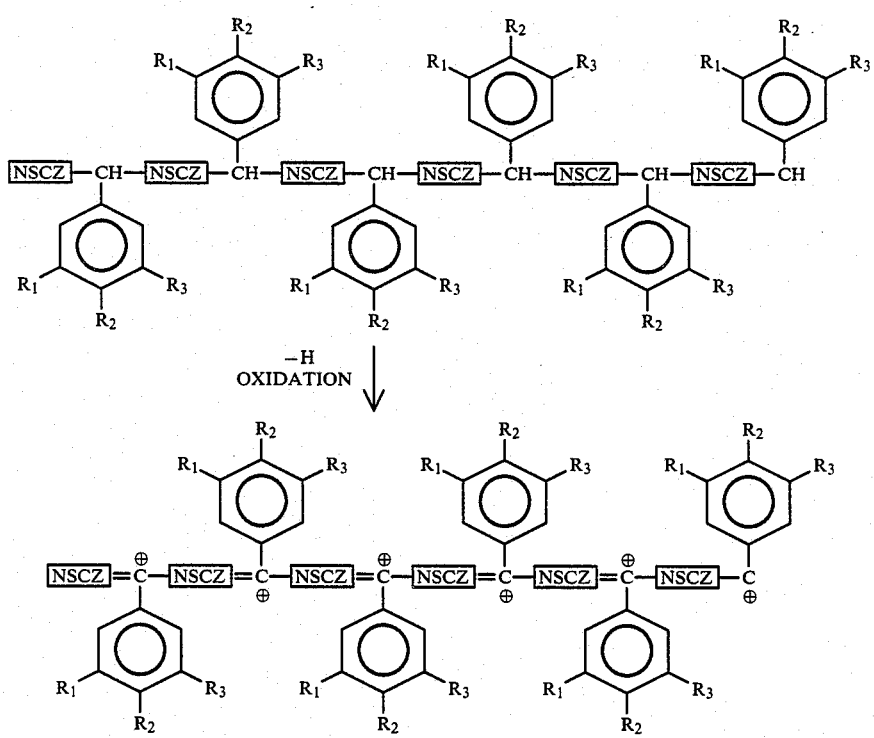

where NSCZ is an abbreviation of N-substituted carbazolyl (e.g. N-methylcarbazolyl, N-ethylcarbazolyl).

Characterization of Properties

PMCZPM samples were soluble in N,N-dimethylformamide (DMF), N-methyl-2-pyrrolidinone (NMP) and nitrobenzene and partially soluble in tetrahydrofuran (THF) and methylene chloride. Molecular weight characterization was done using a Waters Model 150C gel permeation chromatograph (GPC) using THF solvent at 35° C. The GPC was packed with $10^4$, $10^3$ and 500A° ultrastyrogel columns and operated at a flow rate of 1 mL/min. FIG. 1 illustrates how by increasing the polymerization reaction time desired higher molecular weight or degree of polymerization (n) is achieved.

Infrared spectra of PMCZPM thin films cast on KCl substrates from THF or DMF solutions were obtained using a Digilab model FTS-14 Fourier transform spectrometer. Optical absorption measurements in the range 190-3200 nm (0.388-6.53 ev) was done using a Perkin-Elmer Model Lambda 9 UV-VIS-NIR spectrophotometer at 23° C. and thin films cast on sapphire substrates from THF and DMF solutions. The same PMCZPM films on the substrates were subsequently oxidized to different levels by exposures to iodine or bromine vapor at about 50° C. in order to obtain infrared or optical absorption spectra of doped thin films.

The room temperature (23° C.) d.c. conductivity measurement was made on PMCZPM films cast on glass substrates and exposed to iodine or bromine vapor for 1-4 hours using a four-point probe instrument.

Differential scanning calorimetry (DSC) and thermogravimetric analysis (TGA) were done using a DuPont model 1090B Thermal Analyzer instrument and hermetically sealed samples in aluminum pans at heating rates of 20° C./min (DSC) and 10° C./min (TGA).

Some of the results are shown in Table III which depicts characteristics of Examples I and II.

TABLE III

| PMCZPM Samples | Mw | Mn | Mw/Mn | DP | Tg (°C.) | $\sigma(\Omega^{-1}cm^{-1})$ $I_2$ | $\sigma(\Omega^{-1}cm^{-1})$ $Br_2$ |
|---|---|---|---|---|---|---|---|
| Exs. | | | | | | | |
| | 1274 | 1011 | 1.26 | 3.75 | 193 | $10^{-3}$ | 3 |
| II | 2719 | 1936 | 1.40 | 7.2 | 219 | $10^{-3}$ | 6 |

The embodiments of the invention in which an exclusive property or right is claimed are defined as follows:

1. A polymer comprising species selected from the group consisting of carbazole and N-substituted carbazoles and species selected from the group consisting of benzaldehyde and substituted benzaldehyes having the following structure:

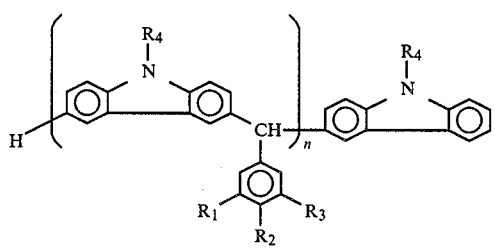

wherein
R$_1$ is selected from H, CH$_3$, F, Cl and Br
R$_2$ is selected from H, CH$_3$, F, Cl, Br, OH, NO$_2$, —OCH$_3$ and —S—CH$_3$
R$_3$ is selected from H, CH$_3$, F, Cl, and Br
R$_4$ is selected from H, CH$_3$, C$_2$H$_5$, and Si(CH$_3$)$_3$
n is an integer between 2 and 500.

2. The polymer of claim 1 wherein R$_4$ is a methyl group (—CH$_3$).
3. The polymer of claim 2 wherein R$_1$, R$_2$ and R$_3$ are H.
4. The polymer of claim 1 wherein R$_2$ is NO$_2$.
5. The polymer of claim 4 wherein R$_1$ and R$_3$ are H.
6. The polymer of claim 5 wherein R$_4$ is CH$_3$.
7. The polymer of claim 1 wherein R$_2$ is OH.
8. The polymer of claim 7 wherein R$_1$ and R$_3$ are H.
9. The polymer of claim 8 wherein R$_4$ is CH$_3$.
10. The polymer of claim 1 wherein R$_2$ is selected from the group consisting of F, Cl and Br.
11. The polymer of claim 2 wherein R$_2$ is selected from the group consisting of F, Cl and Br.
12. The polymer of claim 11 wherein R$_1$ and R$_3$ are H and R$_2$ is F.
13. The polymer according to claim 1 where n is an integer having a value between 2 and 50.
14. An electrically conducting polymer complex comprising species selected from the group consisting of carbazole and N-substituted carbazoles and species selected from the group consisting of benzaldehyde and substituted benzaldehydes having the following structure:

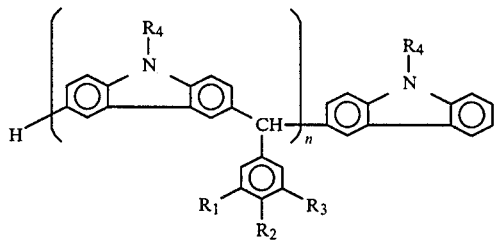

wherein
R$_1$ is selected from H, CH$_3$, F, Cl and Br,
R$_2$ is selected from H, CH$_3$, F, Cl, Br, OH, NO$_2$, —OCH$_3$, and —S—CH$_3$,
R$_3$ is selected from H, CH$_3$, F, Cl and Br,
R$_4$ is selected from H, CH$_3$, C$_2$H$_5$, and
n is an integer between 2 and 500
doped with a compatible charge transfer acceptor selected from the group of sources or dopant counter ions consisting of I$_2$, Br$_2$, Cl$_2$, HI, HBr, HCl, SO$_3$, ClO$_4^-$, HSO$_4^-$, FSO$_3^-$, SO$_3$CF$_3^-$, COOCF$_3^-$, C$_6$H$_2$(NO$_2$)-SO$_3^-$ and CrC$_6$H$_4$SO$_3^-$, AsF$_6^-$, S$_b$F$_6^-$, BF$_4^-$ and FCl$_4^-$ or a combination thereof.

15. The electrically conducting polymer of claim 14 wherein said dopant is selected from the group consisting of I$_2$, Br$_2$, BF$_4^-$ and ClO$_4$.
16. The electrically conducting polymer of claim 15 wherein n is an integer between 2 and 50.
17. The electrically conducting polymer of claim 15 wherein R$_1$, R$_2$ and R$_3$ are H and R$_4$ is —CH$_3$.
18. The electrically conducting polymer of claim 16 wherein R$_1$, R$_2$ and R$_3$ are H and R$_4$ is —CH$_3$.
19. The electrically conducting polymer of claim 15 wherein R$_1$ and R$_3$ are H, R$_2$ is selected from the consisting of F, Cl, Br, NO$_2$, OH, —OCH$_3$ and —S—CH$_3$ and R$_4$ is —CH$_3$.
20. The electrically conducting polymer of claim 16 wherein R$_1$ and R$_3$ are H, R$_2$ is selected from the consisting of F, Cl, Br, NO$_2$, OH, —OCH$_3$ and —S—CH$_3$ and R$_4$ is —CH$_3$.
21. The electrically conducting polymer of claim 19 wherein R$_2$ is F.
22. The electrically conducting polymer of claim 19 wherein R$_2$ is OH.
23. The electrically conducting polymer of claim 19 wherein R$_2$ is NO$_2$.

* * * * *